United States Patent [19]

Usami

[11] Patent Number: 4,893,273

[45] Date of Patent: Jan. 9, 1990

[54] SEMICONDUCTOR MEMORY DEVICE FOR STORING IMAGE DATA

[75] Inventor: Toshiro Usami, Yokohama, Japan

[73] Assignee: Kabushiki Kaisha Toshiba, Kawasaki, Japan

[21] Appl. No.: 842,193

[22] Filed: Mar. 21, 1986

[30] Foreign Application Priority Data

Mar. 28, 1985 [JP] Japan .................................. 60-62102

[51] Int. Cl.$^4$ ........................ G11C 11/40; H01L 29/78
[52] U.S. Cl. .................................. 365/185; 357/23.5; 357/30; 365/114; 365/215
[58] Field of Search ................ 365/185, 184, 104, 182, 365/174, 114, 106, 118, 215; 357/23.5, 30 L, 30 I, 30 R, 30 D

[56] References Cited

U.S. PATENT DOCUMENTS

| | | | |
|---|---|---|---|
| 3,950,738 | 4/1976 | Hayashi et al. | 365/114 |
| 4,366,555 | 12/1982 | Hu | 365/185 |
| 4,665,503 | 5/1987 | Glasser | 365/182 |
| 4,754,320 | 6/1988 | Mizutani et al. | 365/185 |

FOREIGN PATENT DOCUMENTS

| | | | |
|---|---|---|---|
| 2912859 | 10/1980 | Fed. Rep. of Germany | 365/104 |
| 0158879 | 12/1979 | Japan | 357/23.5 |
| 0144974 | 7/1985 | Japan | 357/23.5 |

OTHER PUBLICATIONS

Drangeid, "High Speed Field Effect Structure", IBM Tech. Disc. Bull., vol. 11, No. 3, Aug. 1968, pp. 332-333.

Yoshikawa et al., "Technology Requirements for Mega Bit CMOS EPROMS", Proceedings of the IEEE International Devices Meeting, p. 456-459, Dec. 9-12, 1984.

Fukuzaki et al., "Image Sensor Incorporating an MNOS Type Involatile Memory", Preparing of 1985 National Meeting of Television Society, p. 77, 1985.

Primary Examiner—Glenn A. Gossage
Attorney, Agent, or Firm—Finnegan, Henderson, Farabow, Garrett, & Dunner

[57] ABSTRACT

A first insulating film of a light-transmitting material is formed on a channel region between the source and drain regions on a semiconductor substrate. A floating gate electrode is formed on the first insulating film. A second insulating film is formed on the floating gate electrode. A control gate electrode is formed on the second insulating film. An opening is formed to extend through the control gate electrode, the second insulating film, and the floating gate electrode. The opening is filled with a light-transmitting material. Light incident on the memory cell is guided by the material onto the channel region. When light becomes incident on the channel region while predetermined voltages are applied to the control gate electrode and across the source and drain regions, electron-hole pairs corresponding to the amount of light incident on the memory cell are generated in the channel region, and the electrons are trapped in the floating gate electrode. The threshold value of the memory cell is changed in accordance with the amount of electrons trapped in the floating gate electrode. The memory cell stores digital data in accordance with the change in threshold value, i.e., corresponding to the amount of light incident thereon. When a plurality of memory cells are arranged in a matrix, image data can be two-dimensionally input and stored in the array.

9 Claims, 5 Drawing Sheets

FIG. 9
FIG. 10
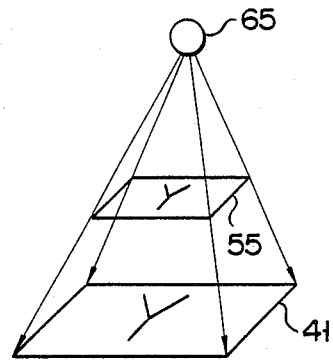
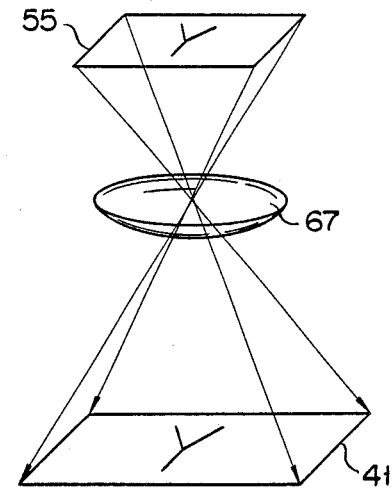
FIG. 11
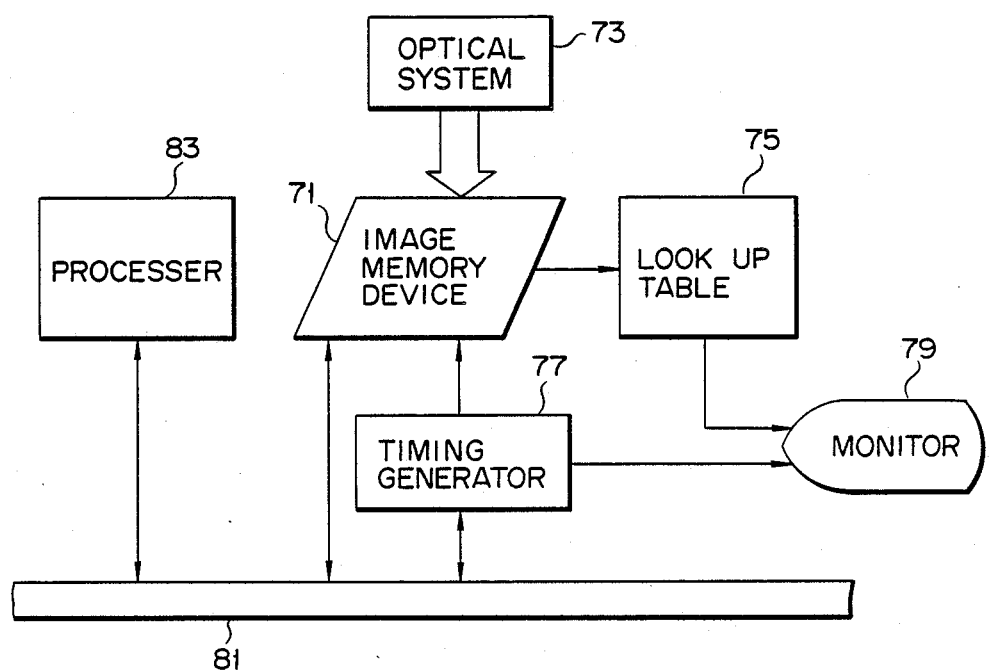

SEMICONDUCTOR MEMORY DEVICE FOR STORING IMAGE DATA

BACKGROUND OF THE INVENTION

The present invention relates to a semiconductor memory device for storing image data and, more particularly, to a rewritable nonvolatile semiconductor memory device for storing image data.

A rewritable image data storage system of the following configuration has been known for storing image data. Image data is first obtained by a digitizer, an imaging device, or the like. The data obtained by the digitizer is time-serially supplied to a processor or a vector generator through a data bus. The processor or vector generator processes the digital signal, to produce pixel data. The processor or vector generator then stores the pixel data in a frame buffer. The image data stored in the frame buffer is converted as needed into a luminance signal through reference to a look-up table. The luminance signal from the look-up table and a timing signal generated from a timing generator are supplied to a monitor device, which then displays them as an image. In order to rewrite part of the image data in such a system, the stored content of memory cells in the frame buffer must be rewritten.

With this system, however, an expensive digitizer or imaging device is necessary to obtain the image data, and thus the total cost of the system becomes very high.

When the system is energized, a time-serial signal from the digitizer must be written in the frame buffer. When image data has already been stored on a magnetic disk or the like, the storage data must be read out therefrom and rewritten in the frame buffer The frame buffer often comprises a dynamic RAM. Writing data in the dynamic RAM must be performed outside of the data readout period. For this reason, when a large-capacity dynamic RAM is used, efficiency the data writing in the frame buffer is degraded. For example, when a frame buffer having a display resolution of 1,280×1,024 pixels and a refresh rate of 60 Hz comprises a 16-kbit dynamic RAM, the time used for the data write operation is 80% of the total cycle time. When the frame buffer comprises 32 64-kbit dynamic RAMs, the time used for the data write operation is reduced to 30% of the total cycle time.

Even if a dynamic RAM having a very high-speed cycle time is used, it is inefficient for serial image data to be obtained from an external imaging device and written in a memory.

SUMMARY OF THE INVENTION

It is an object of the present invention to provide a simple, inexpensive semiconductor image memory device which requires no electrical image data write operation.

In order to achieve the above object of the present invention, there is provided memory cell for an image memory device comprising:

a semiconductor body (11);

a source region (17) and a drain region (19) formed in the semiconductor body;

a first gate insulating film (21) formed on a channel region between the source and drain regions (17, 19) of the semiconductor body;

a floating gate electrode (23) formed on the first gate insulating film (21);

a second gate insulating film (25) formed on the floating gate electrode (23);

a control gate electrode (27) formed on the second insulating film (25); and means (29, 31) for guiding light incident on the memory cell onto at least said (channel region.

With the above arrangement, an image memory device according to the present invention can serve both as a memory device and an imaging device, thus simplifying the arrangement and handling of the image memory device. Since image data can be directly stored in a memory cell array, an expensive digitizer or imaging device requiring complex data processing is unnecessary, and an inexpensive image memory device can be provided. In addition, an image can be two-dimensionally and directly stored in a memory cell array. For this reason, the time required to write data in an image data memory device is shorter than for a conventional device. Since the memory is nvolatile data can be retained until data erasure is performed. Furthermore, since data processing is the same as for a normal EPROM, image data can be freely rewritten as needed.

BRIEF DESCRIPTION OF THE DRAWINGS

FIGS. 9 and 10 are illustrations explaining other arrangements for storing image data in the image memory device shown in FIG. 3; and FIG. 11 is a block diagram showing an image storage processing system to which the image memory device shown in FIG. 3 is applied.

DETAILED DESCRIPTION OF THE INVENTION

An image memory device according to the present invention will now be described with reference to the accompanying drawings.

Figure 1:
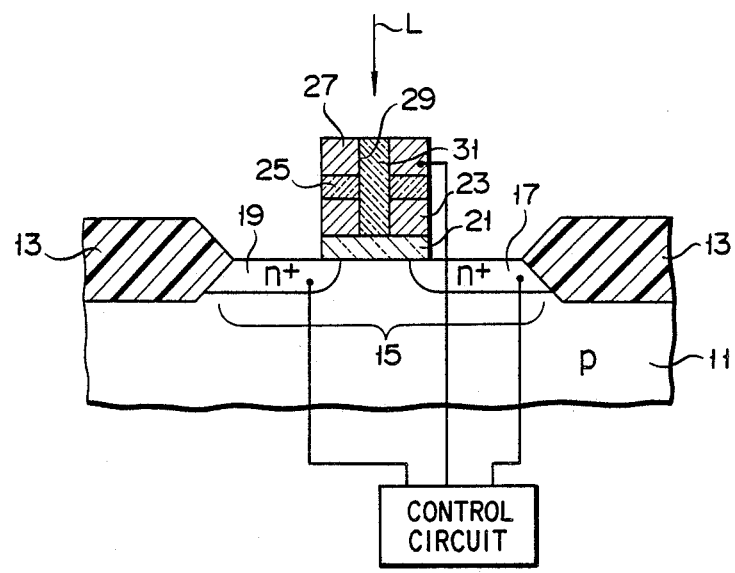
FIG. 1 is a sectional view for explaining a memory for storing image data according to an embodiment of the present invention.
Figure 2:
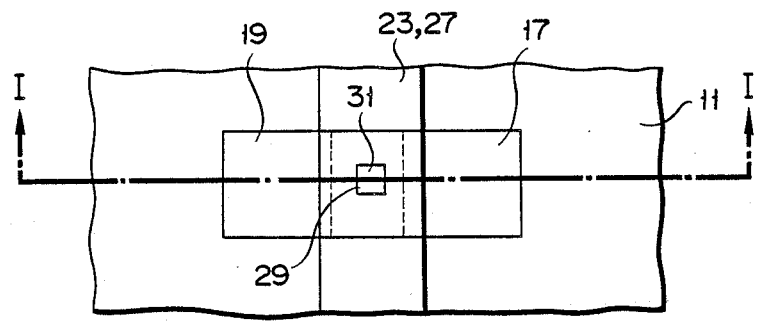
FIG. 2 is a plan view of the memory cell shown in FIG. 1.

A structure of a memory for storing image data in an image memory device according to an embodiment of the present invention will be described with reference to FIGS. 1 and 2. In FIG. 1, portions (e.g., a passivation film) unnecessary for the following description are omitted for the sake of clarity. FIG. 2 is a view showing the planar positional relationship of the main part in FIG. 1, and portions unnecessary for the following descriptions are also omitted. Note that FIG. 1 is a sectional view taken along line I—I in FIG. 2.

As will be described later, the memory cell has both memory and image sensing functions.

A portion of a p-type semiconductor body (or p-type semiconductor well) 11, having an impurity concentration of, e.g., $10^{15}/cm^3$, is electrically isolated from other regions by field oxide film 13. N-type source and drain regions 17 and 19, having sheet resistance of 50 $\Omega/\square$, are formed in element forming region 15 of body 11. Gate insulating film 21 is formed on a channel region between source and drain regions 17 and 19. Gate insulating film 21 comprises a light-transmitting material (e.g., $SiO_2$), and is, e.g., 40 nm thick. Floating gate electrode 23 is formed on film 21. Electrode 23 comprises polycrystalline silicon in which an impurity (e.g, phosphorus) is doped, is electrically isolated from other portions, and has a thickness of, e.g., 400 nm. Gate insulating film 25 is formed on gate electrode 23. Control gate electrode 27 is formed on film 25. Electrode 27 comprises phosphorus-doped polycrystalline silicon and has a thickness of about 400 nm. This arrangement is substantially the same as that of a normal EPROM memory cell.

As shown in FIG. 2, hole 29 extending through layers 23, 25, and 27 is formed in substantially the central portion of the multilayered structure (corresponding to the central portion of the channel region) comprising control gate electrode 27, gate insulating film 25, and floating gate electrode 23. Hole 29 is formed with a square shape having 1-$\mu$m sides. Opening 29 is filled with light-transmitting insulating material 31 (e.g., $SiO_2$).

Note that gate insulating film 21 also has light transmission properties. For this reason, light L emitted above the memory cell is radiated onto the channel region of body 11 through an optical path formed by opening 29 (material 31) and gate insulating film 21.

Figure 3:
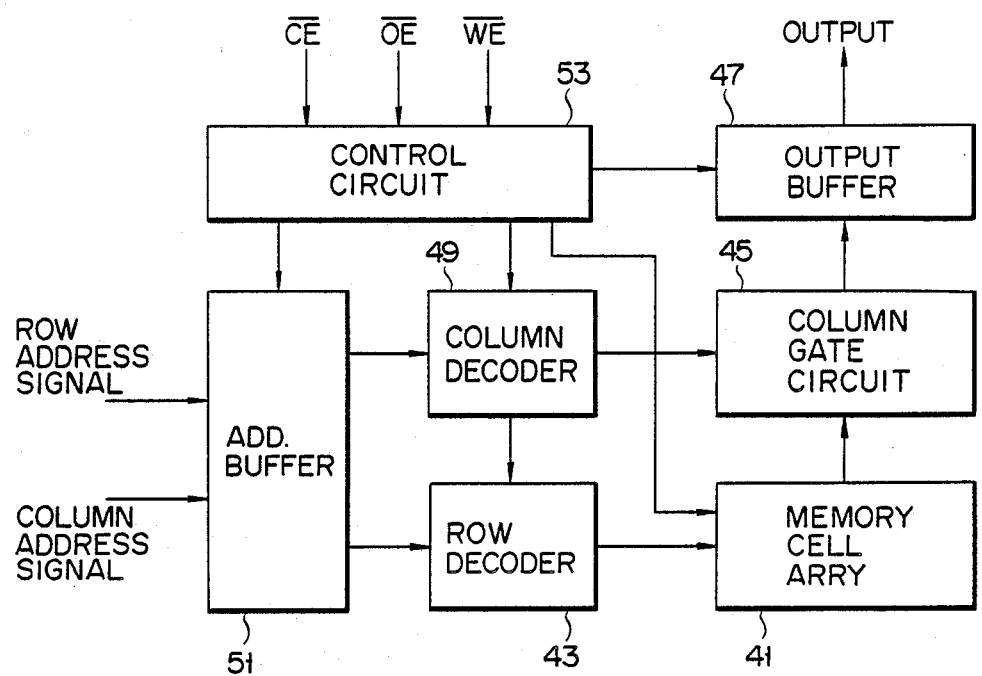
FIG. 3 is a block diagram for explaining an arrangement of an image memory device according to an embodiment of the present invention.

An embodiment of the image memory device having the memory cells with the structure shown in FIGS. 1 and 2 will now be described with reference to FIG. 3. The structure of the image memory device shown in FIG. 3 is substantially the same as that of a normal ultraviolet erasable read-only semiconductor memory device (EPROM).

The memory cells shown in FIGS. 1 and 2 are arranged in rows and columns on an identical plane in a matrix, thus constituting memory cell array 41. Row decoder 43 is connected to array 41. Row decoder 43 selects a row of memory cells constituting array 41. Column gate circuit 45 is also connected to array 41. Gate circuit 45 selectively generates output data from the memory cells in specified columns among the memory cells in one row selected by row decoder 43. Output buffer 47 is connected to circuit 45 and externally outputs data selected thereby. Column decoder 49 is connected to circuit 45 for controlling the same. Address buffer 51 is connected to decoders 43 and 49. Address buffer 51 receives and temporarily stores row and column address signals from an external device and supplies them to decoders 43 and 49. Control circuit 53 is connected to output buffer 47, decoder 49, and address buffer 51. Control circuit 53 receives control signals, e.g., chip enable signal $\overline{CE}$, output enable signal $\overline{OE}$, and read/write switching signal $\overline{WR}$ (i.e., a write enable signal), and controls array 41, decoder 49, output buffer 47, and address buffer 51 as instructed by the signals $\overline{CE}$, $\overline{OE}$, $\overline{WR}$.

The operation of the memory cell shown in FIGS. 1 and 2 and the image memory device shown in FIG. 3 will now be described.

Figure 4:
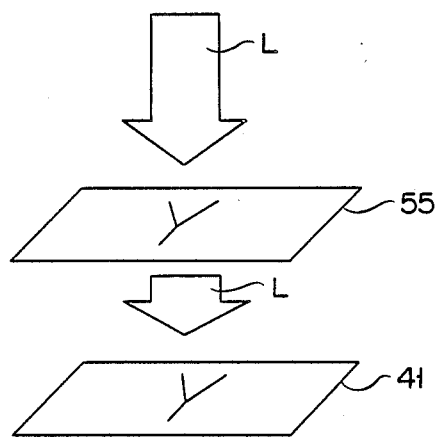
FIG. 4 is an illustration explaining an arrangement for storing an image in the image memory device shown in FIG. 3.

First, a method of storing image data in the memory cells shown in FIGS. 1 and 2 and the image memory device (more specifically, memory cell array 41) shown in FIG. 3 will be described with reference to FIG. 4. As shown in FIG. 4, the letter, "Y" is to be stored in the image memory device.

Read/write switching signal $\overline{WR}$ is switched to the write mode level. In response to this, control circuit 53 applies a bias voltage across source and drain regions 17 and 19 (FIGS. 1 and 2) of the memory cells constituting array 41, and applies a high voltage (e.g., 15 V) to control gate electrode 27. In this state, an image ("Y") is projected on array 41 for a predetermined period of time (e.g., 1 second), as shown in FIG. 4. An arrangement for the above process can be easily provided by a normal optical system (e.g., a light source, a lens system, and a shutter). Referring to FIG. 4, light beam L is transmitted through screen 55, on which letter "Y" is displayed, and is radiated onto array 41. In this way, a Y-shaped portion on which no light is radiated is formed on array 41. Of the memory cells constituting array 41, light is radiated onto bodies 11 (channel regions) of the cells irradiated with light through the optical path constituted by opening 29 and film 21. For this reason, electron-hole pairs (pairs of electron or electrons and hole or holes) are generated in each channel region corresponding to the amount of light radiated thereon. Electrons generated in the channel regions are trapped and accumulate in floating gate electrode 23. When electrons accumulate in electrode 23, the threshold voltage of the memory cell is increased. Since no electron-hole pairs are generated in the channel regions of the memory cells onto which no light is radiated, however, no electrons are trapped in electrode 23. For this reason, the threshold voltage of these cells is kept low. Assuming that the increased threshold voltage is defined as "1" level and the unchanged voltage is defined as "0" level, the Y-shaped image data is stored in the individual memory cells as "1" or "0" level data. For example, if light is radiated onto array 41, as shown in FIG. 4, "0" level data is stored in the memory cells not irradiated with Y-shaped light, and "1" level data is stored in those which are irradiated with light.

Note that the voltage applied across source and drain regions 17 and 19 and the voltage applied to electrode 27 are not specified. When a threshold level (digitizing threshold level) for distinguishing a "light input state" from a "no light input state" is to be lowered, a high voltage must be applied. When the threshold level is to be raised, a low voltage can be applied. Light irradiation time for the image data is also a problem. However, the threshold voltage must not be so high that electrons are trapped in the floating electrode irrespective of the absence of light input. Thus, the threshold voltage must be set such that electrons are trapped in the floating gate electrode only when light is radiated onto the channel region and electron-hole pairs are generated therein. Meanwhile, image data can be stored in the memory cells by controlling not only the light irradiation time but also the high voltage application time with respect to control gate electrode 27.

The operation for reading out image data from the image memory device will be described. The read operation is virtually the same as that in a normal EPROM. Chip enable signal $\overline{CE}$ and output enable signal $\overline{OE}$ are set at "1" level, thereby allowing the control of various operations by control ciruit 53. Row and column address signals are supplied to address buffer 51. The row address signal is then supplied to row decoder 43. Row decoder 43 sets in a read enable state the memory cells in the row designated by the row address signal. The storage data is thus supplied to column gate circuit 45 from the memory cells in the selected row. Meanwhile, the column address signal supplied to buffer 51 is supplied to column decoder 49. In response to this, decoder 49 causes gate circuit 45 to generate data in columns designated by the column address signal (e.g., 8 columns when array 41 has a 1,280×1,024 matrix) in the form of, e.g., serial data. The output data from gate circuit 45 is output through output buffer 47. The contents of the address signals are then updated, and the storage data is sequentially read out from array 41.

A method of erasing image data stored in array 41 will now be described. Array 41 is irradiated with ultraviolet rays or X-rays as in a normal EPROM, thereby erasing the storage contents.

When the image memory device of this embodiment is used, image data can be directly stored in array 41 without using an expensive digitizer or imaging device. More specifically, array 41 serves both as an image sensing element and as a memory device, thus reducing the total cost of the image memory device. Furthermore, since the image data is two-dimensionally written in array 41 upon light irradiation, the time required for writing image data in the image memory device can be greatly reduced compared with conventional devices, in which rows and columns are electrically designated to write data.

In addition to the above advantages, floating gate electrode 23 is electrically floated by insulating film 21 in such an EPROM type memory cell. Once the data is written in a memory cell, it will be retained until it is erased. Since data is easily erased with ultraviolet rays just as in a normal EPROM, image data can be rewritten freely.

Figure 5A:
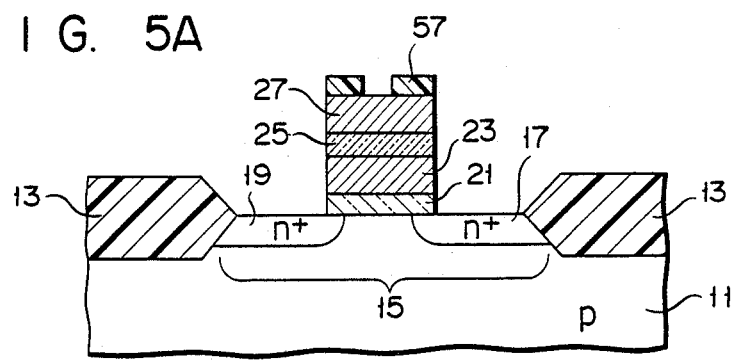
FIGS. 5A, 5B and 5C are sectional views showing the steps in the manufacture of the memory cell shown in FIG. 1.
Figure 5B:
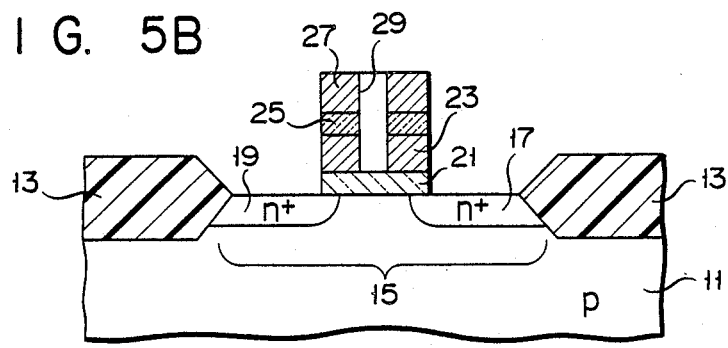
Figure 5C:
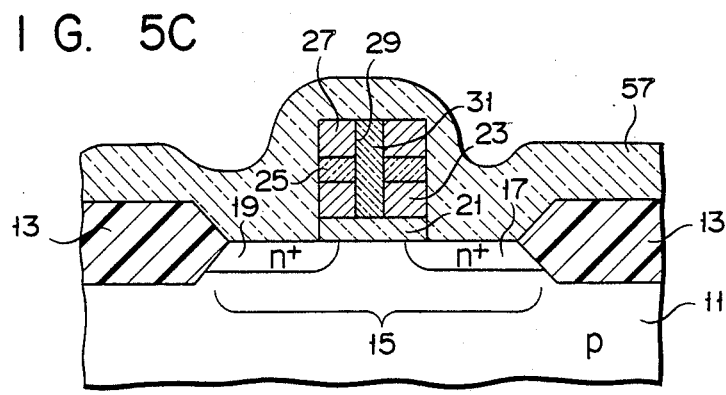

A method of manufacturing the memory cell shown in FIGS. 1 and 2 will now be described with reference to FIGS. 5A to 5C.

First, a structure is prepared consisting of semiconductor substrate 11 having source and drain regions 17 and 19; field oxide film 13; gate insulating films 21 and 25; floating gate electrode 23; and control gate electrode 27. Photoresist 57 has an opening that will be used to form hole 29 shown in FIG. 5A. Next, opening 29, extending through electrodes 23 and 27 and gate insulating film 25, is formed by a reactive ion etching (RIE) method using photoresist 57 as a mask. Photoresist 57 is then removed, as shown in FIG. 5B. Wiring layers and the like (not shown) are formed on the resultant structure. Finally, as shown in FIG. 5C, opening 29 is filled with material 31, and passivation film 57 of a light-transmitting insulating material is formed over the entire surface of the structure, thus producing a memory cell with an optical path.

Alternatively, the memory cell can be manufactured as follows. First, a light-transmitting first insulating film is formed as gate insulating film 21. A first polycrystalline silicon layer serving as floating gate electrode 23 is formed on the first insulating film. Boron is ion-implanted into a predetermined portion of the first polycrystalline silicon layer at an acceleration voltage of 100 keV so as to obtain a boron concentration of $10^{16}/cm^{-2}$. Then, the first polycrystalline silicon layer is annealed. Since the ion-implanted portion of the first polycrystalline silicon layer oxidizes faster, it is converted into light-transmitting silicon dioxide. Next, a light-transmitting second insulating layer is formed as gate insulating film 25. A second polycrystalline silicon layer acting as control gate electrode 27 is formed on the second insulating layer. Ions are implanted into a given portion of the second polycrystalline silicon layer just as in the first polycrystalline silicon layer. Annealing is then performed so as to oxidize the doped portion. The above four layers are etched to form floating gate electrode 23, control gate electrode 27, and gate oxide films 21 and 25. The resultant structure is the same as that shown in FIGS. 1 and 2.

Figure 6:
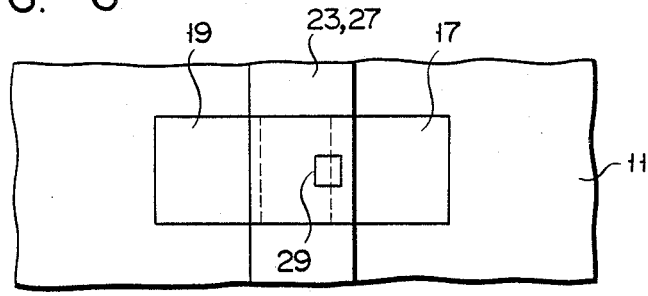
FIG. 6 is a plan view for explaining an arrangement of a memory cell for storing image data according to another embodiment of the present invention.

In the above embodiment, opening 29 is formed at substantially the center of the four-layered structure consisting of the gate electrodes and the like, but as shown in the plan view of FIG. 6, opening 29 can be formed on a boundary portion between the channel region and source or drain region 17 or 19, so that external light is radiated onto the boundary portion between the channel region and regions 17 or 19. The boundary portion allows easier generation of electron-hole pairs. Thus, the structure shown in FIG. 6 has a higher sensitivity than that shown in FIGS. 1 and 2.

Figure 7:
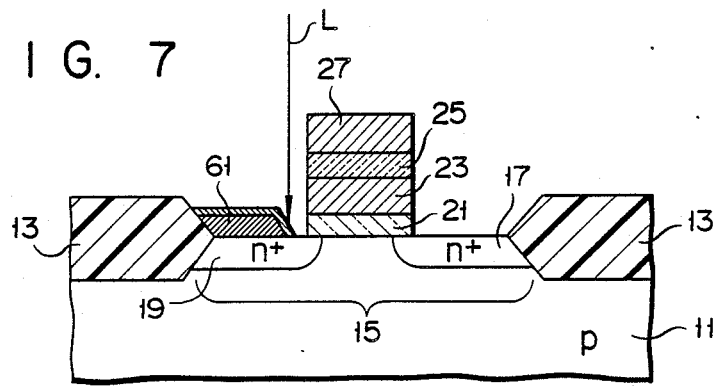
FIGS. 7 and 8 are sectional views showing arrangements of memory cells for storing image data according to other embodiments of the present invention.

In the above embodiment, opening 29 is formed in floating gate electrode 23 and the like to create an optical path. However, the present invention is not limited to this. Any arrangement which can guide light incident on a memory cell to the channel region can be adopted. For example, as shown in FIG. 7, layer 61 having a light reflective surface (e.g., aluminum) can be formed to be inclined at a given angle with respect to the surface of substrate 11. When layer 61 is formed, light L emitted above a memory cell is reflected by layer 61 and becomes incident on the channel region. With this structure, image data can be stored in the memory cell.

Figure 8:
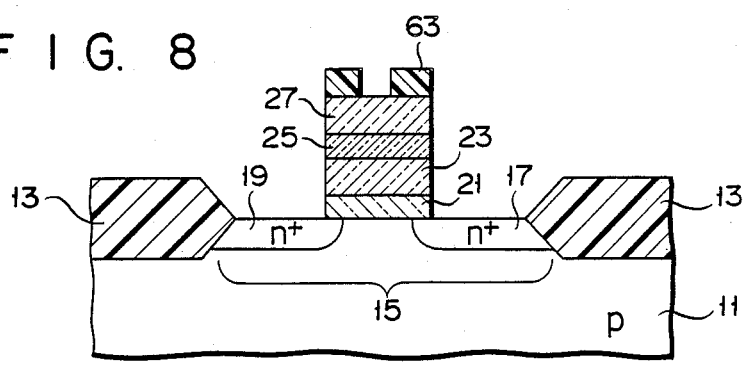

Alternatively, as shown in FIG. 8, gate insulating films 21 and 25, floating gate electrode 23, and control gate electrode 27 can comprise a light-transmitting material (e.g., polycrystalline silicon having a thickness of 20 nm or less, or an organic conductive material). In this case, light becomes incident on the channel region through electrodes 23 and 27 and gate insulating films 21 and 25. In order to control (decrease) the amount of light incident on the channel region, member 63, consisting of a non-light-transmitting material and serving as a diaphragm, can be formed on control gate electrode 27.

In the above descriptions, memory cells for storing image data are produced separately but the present invention is not limited to this. When memory cells are arranged in a matrix to constitute memory cell array 41, a drain is commonly formed for each two adjacent memory cells, and the sources of the memory cells in the same row can be commonly formed. In addition, an n-channel type memory cell formed on a p-type semiconductor substrate has been described, but a p-channel type cell is also possible.

Another arrangement of an optical system for writing image data into memory cell array 41 will now be described with reference to FIG. 9. Referring to FIG. 9, light beams from spot light source 65 pass through screen 55 and reach memory cell array 41. With this arrangement, image data can be written in array 41. Alternatively, as shown in FIG. 10, an external image is input, through lens 67, using the same structure as in a camera with memory cell array 41 being located at the film position in the camera. Thus, a real image is focused on array 41 to write image data therein. Although not shown in FIGS. 9 and 10, a shutter can be provided in order to focus the image on array 41 for a predetermined period of time. Similarly, when the image is focused on array 41, a pulse control signal is applied to control gate 27 to store the image in array 41. Furthermore, a pulse voltage can be applied accross source and drain regions 17 and 19 so as to store image data in array 41.

Applications of the image memory device according to the present invention will be described with reference to FIG. 11. FIG. 11 is a block diagram of a system having image sensing, storing, displaying, and correcting functions for image data using the image memory device shown in FIG. 3.

Image memory device 71 has the arrangement shown in FIG. 3. Device 71 is irradiated with light containing image data emitted from optical system 73. Image data is stored in device 71 upon irradiation of light from system 73. The image data stored in device 71 is converted into a luminance signal with reference to look-up table 75 and is supplied to monitor 79 together with a timing signal generated from timing generator 77. Monitor 79 displays the input image data as an image. Device 71 is connected to processor 83 through bus 81. Processor 83 performs data communication with device 71 through bus 81, and performs various data processing and calculating operations. The data stored in device 71 can be rewritten under the control of processor 83. The rewrite operation can be performed by an operator, such that the operator changes the stored contents while visually observing monitor 79, by processor 83 in accordance with a predetermined program. For example, if image data (e.g., a map, a design drawing, etc.) is stored in device 71, part of the image stored in device 71 can be rewritten and restored in device 71; a new image can be superimposed over the stored image; or image levels can be inverted (i.e., from positive to negative, and vice versa) while visually observing the storage content on monitor 79. Thus, a solid state imaging device can be provided with intelligent electronic processing functions. In FIG. 11, since the arrangements of look-up table 75, timing generator 77, monitor 79, bus 81, and processor 83 themselves are known to those skilled in the art, a detailed description thereof will be omitted.

The applications of the image memory device will now be described.

Computer Graphics (CG)

In CG, a target image often consists of a large number of image pixels, which may include a human body, the interior of a house, a tool, a landscape, etc. These image pixels are synthesized such that a TV signal is converted into a digital signal, the digital signal is time-serially stored in the memory of a computer, and the storage data is modified through reduction, enlargement, angular conversion, or parallel movement, consuming much time. However, the image memory device of the present invention allows quick, easy image pixel input. In addition, the image pixels can be retained unchanged in the memory of the computer.

ID (Identification) System

When fingerprints are used with an ID system, the registration procedure, the time required therefor, and the like all create problems. The image memory device of the present invention allows simple data input, and easy updating because of its nonvolatility.

OS (Operating System) Input

An OS must often be updated in the use of a computer. In general, the OS is input from a disk to the computer, but much time is required to transfer of OS program. Thus if the OS is converted into image data, it can be two-dimensionally input to the computer using the image memory device of the present invention.

In the image memory device of the above embodiments, single image data is stored. However, a plurality of images can be stored using a plurality of memory devices. When three memory cells are combined and the cell combinations are arranged in a matrix form, the memory device of the present invention can store a color image.

What is claimed is:

1. A memory device for storing image data including a memory cell comprising:
   a semiconductor body;
   a source region and a drain region formed in said semiconductor body;
   a first gate insulating film formed on a channel region between said source and drain regions;
   a floating gate electrode formed on said first gate insulating film;
   a second gate insulating film formed on said floating gate electrode;
   a control gate electrode formed on said second gate insulating film;
   means for guiding light incident on said memory cell onto at least said channel region; and
   means for applying a first predetermined voltage to said control gate electrode and applying a second predetermined voltage across said source and drain regions, thereby causing said floating gate electrode to accumulate therein electrons of electron-hole pairs generated in said channel region in accordance with an amount of light guided by said light guiding means, and causing said memory cell to store binary data therein based on a change in a threshold level of said memory cell corresponding to the amount of electrons accumulated in said floating gate electrode,
   said first and second predetermined voltages being determined in accordance with threshold levels at which light conducted by said guiding means is determined to be present or absent, a high second predetermined voltage being applied across said source and drain regions to lower the threshold level of said memory cell and a low second predetermined voltage being applied across said source and drain regions to raise said threshold level,
   wherein said light guiding means comprises means for guiding light onto said channel region through said first and second gate insulating films, said floating gate electrode, and said control gate electrode, and
   wherein said first gate insulating film, said floating gate electrode, said second gate insulating film, and said control gate electrode each comprise a light-transmitting material, and
   said light guiding means consists of said first gate insulating film, said floating gate electrode, said second gate insulating film, and said control gate electrode.

2. A memory device according to claim 1, wherein said memory cell further comprises an aperture member for controlling the amount of light incident on said channel region, which is formed on said control gate electrode and at least a portion of which consists of a light-transmitting portion.

3. A memory device according to claim 1, wherein said light guiding means comprises means for guiding light to a central surface portion of said channel region.

4. A memory device according to claim 1, wherein said light guiding means is disposed for guiding light incident on said memory cell to a boundary portion between said channel region and at least one of said source and drain regions.

5. A memory device according to claim 1, wherein a plurality of memory cells for storing image data are arranged in a matrix to constitute a memory cell array for storing image data, and said memory device further comprises:

an optical system for projecting an image onto said memory cell array; and wherein said voltage applying means includes means for receiving a control signal indicative of an image storage mode, and wherein said voltage applying means includes means for applying a first predetermined voltage to said control gate electrode of each memory cell constituting said memory cell array during at least a first predetermined period and a second predetermined voltage across said source and drain regions during at least a second predetermined period in response to the reception of said control signal.

6. A memory device according to claim 1, wherein said voltage applying means applies said first and second predetermined voltages for a predetermined time set in accordance with the threshold level of said memory cell and said first and second predetermined voltages, said predetermined time being decreased when the threshold level of said memory cell is raised and being increased when threshold level of said memory cell is lowered.

7. A memory device according to claim 1, wherein a plurality of memory cells for storing image data are arranged in a matrix to constitute a memory cell array for storing image data, and said memory device further comprises:

an optical system for projecting an image on said memory cell array;

wherein said voltage applying means includes means for receiving a control signal indicative of an image storage mode, and wherein said voltage applying means includes means for applying a first predetermined voltage to said control gate electrode of each memory cell constituting said memory cell array during at least a first predetermined interval and a second predetermined voltage across said source and drain regions during at least a second predetermined interval in response to the reception of said control signal;

means for inputting an address signal; and means for reading out the stored content of the memory cell having the address designated by said address signal.

8. A memory device according to claim 7, further comprising:

processor means for performing data processing in accordance with a predetermined software program, said processor means including means for reading storage data from said image memory device, processing the readout data, and writing the data in said image memory device;

a bus, connected to said processor means and said image memory device, for transferring data;

a timing generator connected to said bus and said image memory device;

a look-up table, connected to said image memory device, for converting data read out from said image memory device into a luminance signal; and a monitor for displaying the image data in accordance with the luminance signal from said look-up table and the timing signal from said timing generator.

9. A memory device for storing image data including a memory cell comprising:

a semiconductor body;

a source region and a drain region formed in said semiconductor body;

a first gate insulating film formed on a channel region between said source and drain regions;

a floating gate electrode formed on said first gate insulating film;

a second gate insulating film formed on said floating gate electrode;

a control gate electrode formed on said second gate insulating film;

means for guiding light incident on said memory cell onto at least said channel region; and means for applying a first predetermined voltage to said control gate electrode and applying a second predetermined voltage across said source and drain regions, thereby causing said floating gate electrode to accumulate therein electrons of electron-hole pairs generated in said channel region in accordance with an amount of light guided by said light guiding means, and causing said memory cell to store binary data therein based on a change in the threshold level of said memory cell corresponding to the amount of electrons accumulated in said floating gate electrode, said first and second predetermined voltages being determined in accordance with a threshold level at which light conducted by said guiding means is determined to be present or absent, a high second predetermined voltage being applied across said source and drain regions to lower said threshold level and a low second predetermined voltage being applied across said source and drain regions to raise said threshold level, wherein said light guiding means comprises means for guiding light onto said channel region through said first and second gate insulating films, said floating gate electrode, and said control gate electrode, wherein said light guiding means comprises a light-transmitting material forming an optical path extending through said first and second gate insulating films, said floating gate electrode, and said control gate electrode, and wherein said first gate insulating film comprises a light-transmitting material;

said floating gate electrode, said second gate insulating film, and said control gate electrode each has an opening therethrough in communication with each other; and said light-transmitting material is disposed in said openings forming said optical path through said first gate insulating film.

* * * * *